United States Patent
Edamura et al.

(10) Patent No.: US 8,330,140 B2
(45) Date of Patent: Dec. 11, 2012

(54) SEMICONDUCTOR LIGHT EMITTING DEVICE

(75) Inventors: Tadataka Edamura, Hamamatsu (JP); Kazuue Fujita, Hamamatsu (JP); Akira Higuchi, Hamamatsu (JP); Naota Akikusa, Hamamatsu (JP); Masamichi Yamanishi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 30 days.

(21) Appl. No.: 12/843,196

(22) Filed: Jul. 26, 2010

(65) Prior Publication Data

US 2011/0024721 A1 Feb. 3, 2011

(30) Foreign Application Priority Data

Jul. 31, 2009 (JP) ................ P2009-179512

(51) Int. Cl.
*H01L 31/00* (2006.01)

(52) U.S. Cl. .............. 257/13; 257/14; 257/E33.004

(58) Field of Classification Search .......... 257/13–14, 257/E33.005
See application file for complete search history.

(56) References Cited

U.S. PATENT DOCUMENTS

| | | | |
|---|---|---|---|
| 5,457,709 A | 10/1995 | Capasso et al. | |
| 5,745,516 A | 4/1998 | Capasso et al. | |
| 6,137,817 A * | 10/2000 | Baillargeon et al. | 372/45.01 |
| 6,751,244 B2 | 6/2004 | Faist et al. | |
| 6,922,427 B2 | 7/2005 | Faist et al. | |
| 2004/0161009 A1* | 8/2004 | Edamura et al. | 372/45 |
| 2010/0158056 A1* | 6/2010 | Shin et al. | 372/29.016 |

FOREIGN PATENT DOCUMENTS

| | | |
|---|---|---|
| JP | 08-279647 | 10/1996 |
| JP | 2903017 | 3/1999 |
| JP | 2008-010733 | 1/2008 |
| JP | 2008-060396 | 3/2008 |
| JP | 2008-177366 | 7/2008 |

OTHER PUBLICATIONS

R. Huang et al., "Experimental evidence of stimulated scattering of excitons into microcavity polaritons", The American Physical Society, Physical Review, B vol. 61, No. 12, Mar. 15, 2000.
Gabriel Christmann et al., "Room temperature polariton lasing in a GaN/AlGaN multiple quantum well microcavity", American Institute of Physics, Applied Physics Letters 93, Aug. 4, 2008.

* cited by examiner

*Primary Examiner* — Eugene Lee
*Assistant Examiner* — Elias M Ullah
(74) *Attorney, Agent, or Firm* — Drinker Biddle & Reath LLP

(57) ABSTRACT

A semiconductor light emitting device including a semiconductor substrate and an active layer which is formed on the substrate and has a cascade structure formed by multistage-laminating unit laminate structures 16 each including an emission layer 17 and an injection layer 18 is configured. The unit laminate structure 16 has a first upper level L3, a second upper level L4, and a lower level L2 in the emission layer 17, and an injection level L1 in the injection layer 18, an energy interval between the levels L3 and L4 is set to be smaller than the energy of an LO phonon, the layer thickness of the exit barrier layer is set in a range not less than 70% and not more than 150% of the layer thickness of the injection barrier layer, light is generated by emission transition in the emission layer 17, and electrons after the emission transition are injected from the level L2 into the level L4 of the emission layer of a subsequent stage via the level L1. Accordingly, a semiconductor light emitting device using polaritons, capable of performing a light emitting operation by current injection, is realized.

5 Claims, 12 Drawing Sheets

Fig.5
(a)
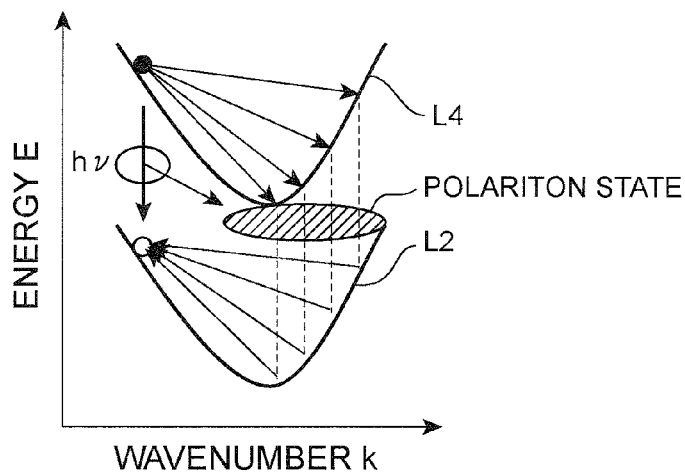
(b)
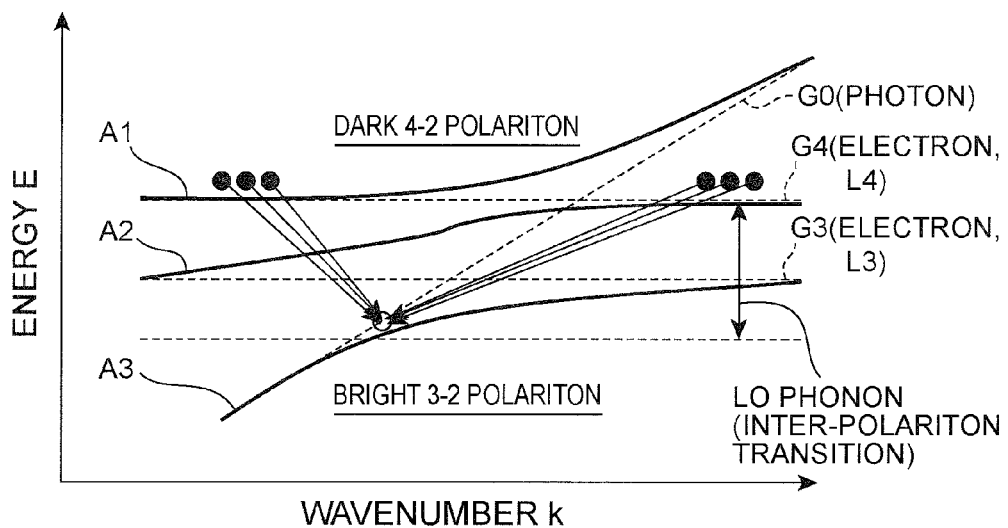

Fig.8
(a)
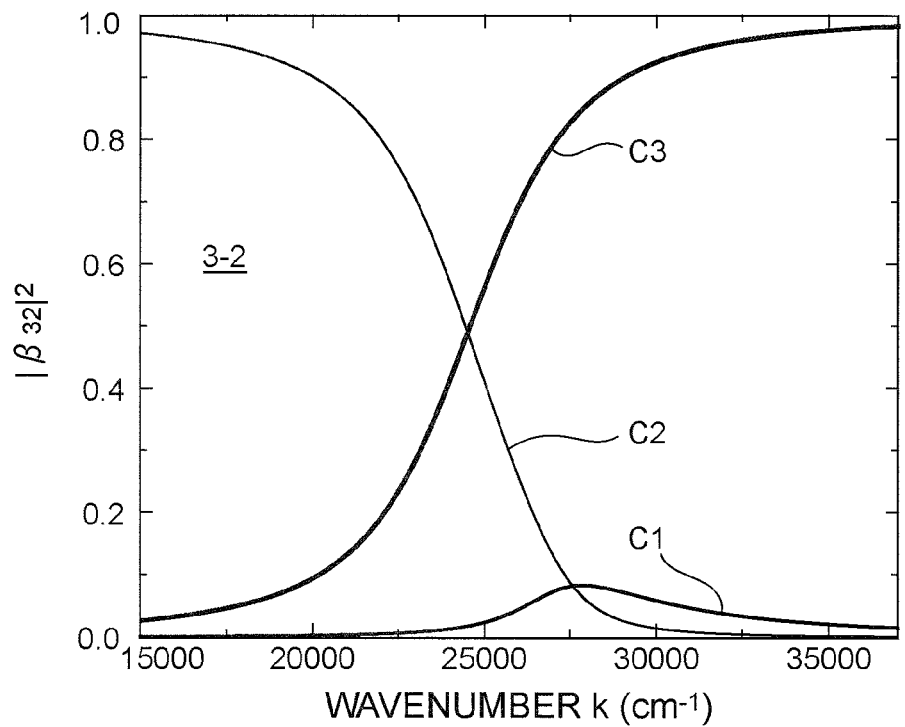
(b)
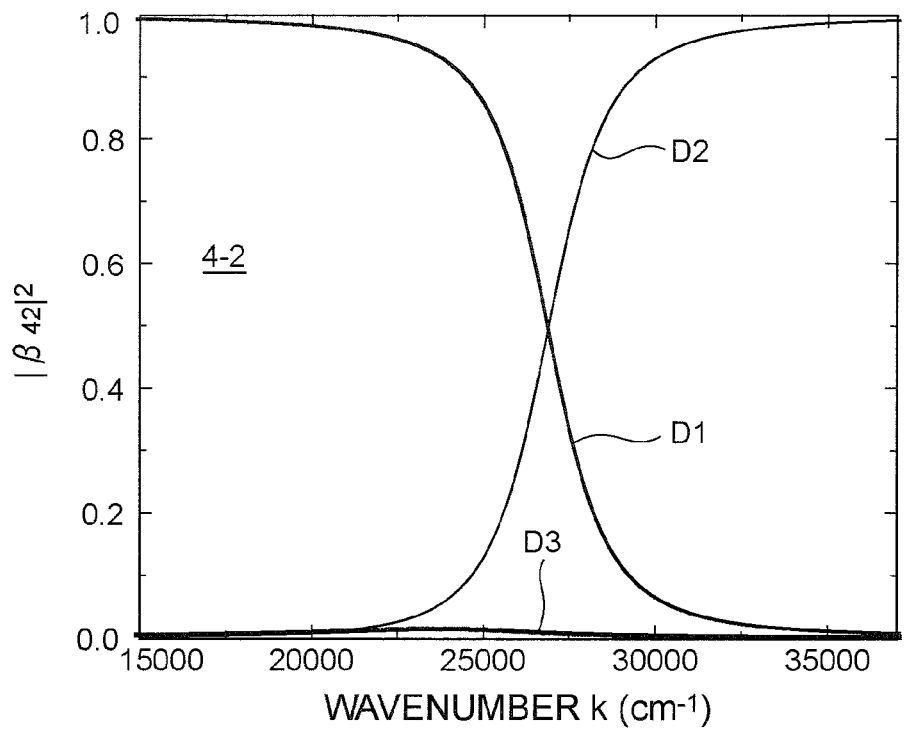

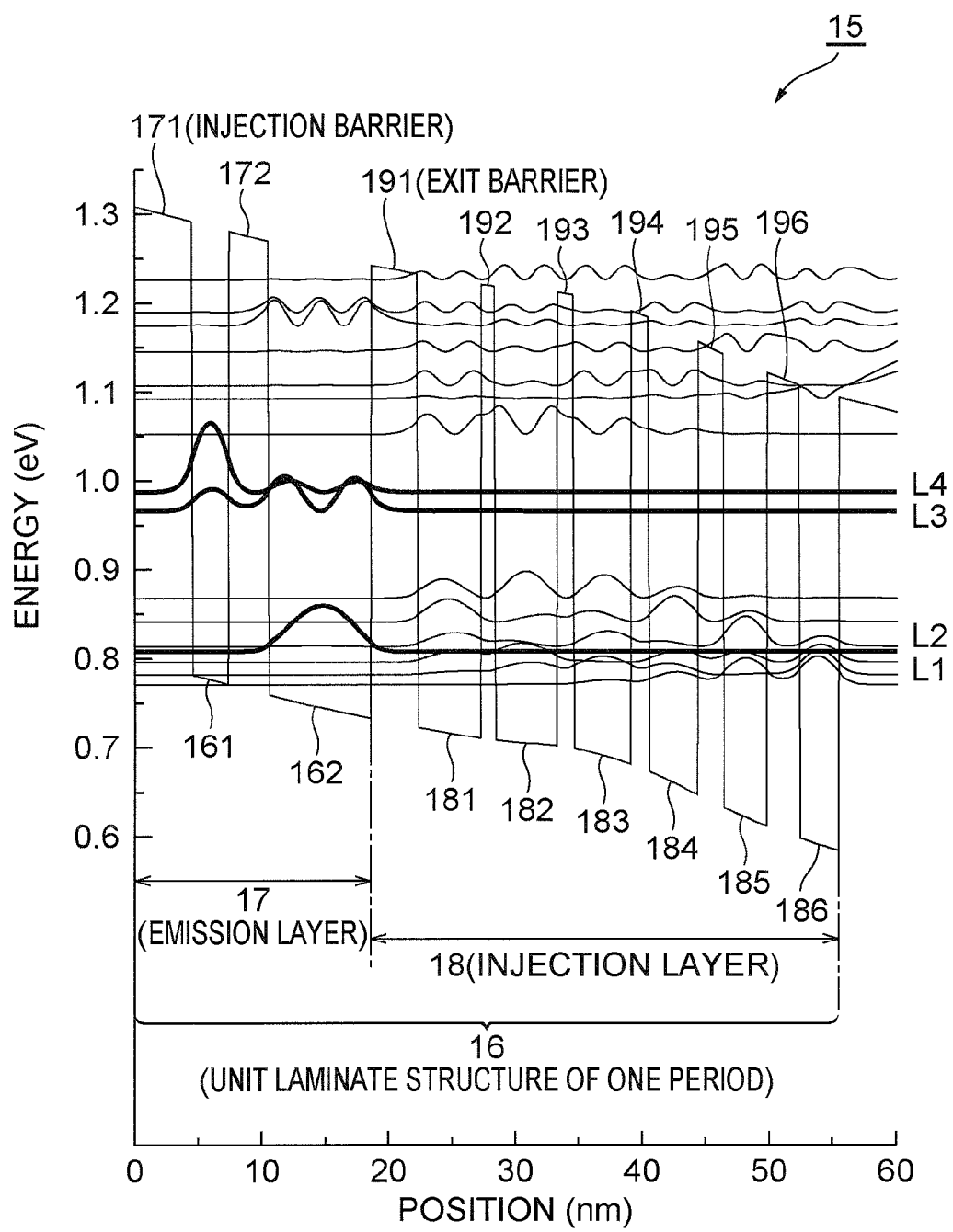

Fig.11

| SEMICONDUCTOR LAYER | | COMPOSITION | LAYER THICKNESS (nm) | CARRIER DENSITY (cm-3) |
|---|---|---|---|---|
| INJECTION BARRIER LAYER 171 | | InAlAs | 4.5 | undoped |
| EMISSION LAYER 17 | WELL LAYER 161 | InGaAs | 3.0 | undoped |
| | BARRIER LAYER 172 | InAlAs | 3.0 | undoped |
| | 162 | InGaAs | 8.2 | undoped |
| EXIT BARRIER LAYER 191 | | InAlAs | 3.6 | undoped |
| INJECTION LAYER 18 | WELL LAYER 181 | InGaAs | 5.1 | undoped |
| | BARRIER LAYER 192 | InAlAs | 1.0 | undoped |
| | 182 | InGaAs | 5.0 | undoped |
| | 193 | InAlAs | 1.2 | undoped |
| | 183 | InGaAs | 4.6 | $1 \times 10^{18}$ |
| | 194 | InAlAs | 1.3 | $1 \times 10^{18}$ |
| | 184 | InGaAs | 4.0 | $1 \times 10^{18}$ |
| | 195 | InAlAs | 1.9 | undoped |
| | 185 | InGaAs | 3.5 | undoped |
| | 196 | InAlAs | 2.5 | undoped |
| | 186 | InGaAs | 3.2 | undoped |

SEMICONDUCTOR LIGHT EMITTING DEVICE

BACKGROUND OF THE INVENTION

1. Field of the Invention

The present invention relates to a semiconductor light emitting device which generates light by emission transition using a subband level structure in a quantum well structure.

2. Related Background Art

In a conventional semiconductor laser, limits of reduction of threshold and of reduction of power consumption are determined generally according to a carrier injection rate for forming a population inversion necessary for laser oscillation. As one of the methods for exceeding the limit, a method for configuring a light emitting device by using polaritons in a resonator is considered. In a light emitting device using polaritons, by Bose-Einstein condensation (BEC), coherent light can be generated with very few injected carriers without forming a population inversion.

Here, polaritons are quasi-particles obtained by quantizing a coupled wave formed by strong coupling between an electron system and a photon system in a material. For example, when light is made incident on a material and is in a resonance state, an electron and a photon are coupled and propagate as a polariton in the material. Moreover, when the polariton propagates inside the material and reaches the material surface, it is converted into a photon with the same frequency and emitted to the outside. In addition, polaritons are bosons that obey Bose-Einstein statistics similar to photons, and therefore, the number of particles occupying a certain state can be very large (for example, refer to Patent Document 1, and Non-Patent Documents 1 and 2).

Patent Document 1: Japanese Patent Publication No. 2903017
Patent Document 2: U.S. Pat. No. 5,457,709
Patent Document 3: U.S. Pat. No. 5,745,516
Patent Document 4: U.S. Pat. No. 6,751,244
Patent Document 5: U.S. Pat. No. 6,922,427
Patent Document 6: Japanese Patent Application Laid-Open No. H8-279647
Patent Document 7: Japanese Patent Application Laid-Open No. 2008-177366
Patent Document 8: Japanese Patent Application Laid-Open No. 2008-60396
Non-Patent Document 1: R. Huang et al., "Experimental Evidence of Stimulated Scattering of Excitons into Microcavity Polaritons," Phys. Rev. B Vol. 61 (2000) pp. R7854-R7857
Non-Patent Document 2: G. Christmann et al., "Room Temperature Polariton Lasing in a GaN/AlGaN Multiple Quantum Well Microcavity," Appl. Phys. Lett. Vol. 93 (2008) pp. 051102-1-051102-3

SUMMARY OF THE INVENTION

Concerning the light emitting device using polaritons described above, in recent years, it has been shown through experiments of photoexcitation at ultralow temperatures that laser oscillation is caused with an ultralow threshold without forming an inverted population by using exciton-polaritons generated in a micro resonator. For example, in Non-Patent Document 1 (R. Huang et al., Phys. Rev. B Vol. 61 (2000) R7854), emission derived from exciton-polaritons, caused by photoexciting a GaAs/AlGaAs-based microcavity at an ultralow temperature of 4.8K, was observed. Moreover, in Non-Patent Document 2 (G. Christmann et al., Appl. Phys. Lett. Vol. 93 (2008) 051102), emission derived from exciton-polaritons at a room temperature, caused by photoexciting a GaN/AlGaN-based microcavity, was observed.

However, all of the conventional light emitting devices using polaritons described above use photoexcitation in a microcavity structure, and are not practical devices. Particularly, as a practical light emitting device, it is considered that a light emitting operation using not photoexcitation but current injection is essential. However, it is very difficult to realize current injection in a microcavity structure.

The present invention has been made in order to solve the above-described problem, and an object thereof is to provide a semiconductor light emitting device using polaritons which can perform a light emitting operation by current injection.

The inventors of the present application developed a quantum cascade laser (QCL) as a semiconductor light emitting device using intersubband transition in a quantum well structure (refer to, for example, Patent Documents 2 to 8 for the quantum cascade laser). The quantum cascade laser is a monopolar type laser element which uses a level structure of subbands formed in a semiconductor quantum well structure, and generates light by intersubband electron transition, and realizes high-efficiency and high-output operation by multistage-coupling light emission layers of a quantum well structure in a cascade manner via injection layers.

In consideration of the structure of the quantum cascade laser, the inventors of the present application found that a novel semiconductor light emitting device capable of operating with current injection at a normal temperature by using polaritons could be realized by applying special design conditions which were not used in ordinary quantum cascade lasers when designing the quantum well structure and the subband level structure, and conceived the present invention.

Specifically, a semiconductor light emitting device of the present invention includes: (1) a semiconductor substrate; and (2) an active layer provided on the semiconductor substrate and having a cascade structure formed by alternately laminating quantum well emission layers and injection layers by multistage-laminating unit laminate structures each including the quantum well emission layer and the injection layer, wherein (3) the unit laminate structure included in the active layer has, in its subband level structure, a first upper level, a second upper level which is an energy level higher than the first upper level, and a lower level which are formed in the quantum well emission layer, and an injection level which is formed in the injection layer, (4) the quantum well emission layer includes, in order from the unit laminate structure side of a preceding stage, first to n-th barrier layers (n is an integer of 2 or more) and first to n-th well layers, and the first barrier layer is configured as an injection barrier layer for electrons from the injection layer of the preceding stage to the quantum well emission layer, (5) the injection layer includes, in order from the quantum well emission layer side, first to m-th barrier layers (m is an integer of 2 or more) and first to m-th well layers, and the first barrier layer is configured as an exit barrier layer for electrons from the quantum well emission layer to the injection layer, (6) the energy interval between the first upper level and the second upper level is set to be smaller than the energy of a longitudinal optical phonon, and the layer thickness of the exit barrier layer is set in a range not less than 70% and not more than 150% of the layer thickness of the injection barrier layer, and (7) light is generated by emission transition using the subband level structure formed by the first upper level, the second upper level, and the lower level in the quantum well emission layer, and electrons after the emission transition are injected from the lower level into the second upper level in the quantum well emission layer of a subsequent stage via the injection level in the injection layer.

In the semiconductor light emitting device described above, as a basic structure of the active layer thereof, a cascade structure in which unit laminate structures each including an emission layer and an injection layer, respectively including pluralities of quantum barrier layers and well layers, are multi-stage laminated, is adopted. Then, in a subband level structure in the unit laminate structure, in the emission layer, the first upper level (level 3), the second upper level (level 4) of an energy higher than the first upper level, and the lower level (level 2) are provided, and in the injection layer, the injection level (level 1) is provided. In this configuration, light is generated by emission transition using the first and second upper levels and the lower level in the emission layer, and by the injection level in the injection layer, electrons after the emission transition in the emission layer can be injected into the emission layer of a next period.

In addition, in the above level structure, the energy interval between the first upper level and the second upper level is set to be smaller than the energy of a longitudinal optical (LO) phonon. Accordingly, high-speed relaxation of electrons injected into the second upper level to the first upper level due to LO phonon scattering is prohibited. Further, the layer thickness of the exit barrier layer from the emission layer to the injection layer is set in a range not less than 70% and not more than 150% of the layer thickness of the injection barrier layer. By thus setting the layer thickness of the exit barrier layer thicker than ordinary, the tunneling time of electrons from the lower level in the emission layer to the injection level in the injection layer becomes longer, and electrons are present at the lower level at a high density.

In this configuration, due to electron-electron interaction between an electron at the second upper level which is prohibited from relaxing at a high speed and an electron at the lower level whose tunneling time to the injection layer is set longer, a polariton (4-2 polariton) is generated. Then, by action of the phenomena such as transition of the polariton to another polariton state as emission transition in the subband level structure, light is generated in the emission layer. Moreover, the emission energy at this time is an energy that corresponds to the energy interval between the first upper level and the lower level.

According to the configuration described above, a novel semiconductor light emitting device using polaritons, capable of performing a light emitting operation by current injection, is realized. This light emitting device can be used as a light emitting device equivalent to, for example, an LED. Alternatively, the light emitting device may be configured as a semiconductor laser device by being provided with a resonator structure.

According to the semiconductor light emitting device described above, a cascade structure in which unit laminate structures each including an emission layer and an injection layer are multistage-laminated is adopted, and in a subband level structure in the unit laminate structure, a first upper level, a second upper level, and a lower level are provided in the emission layer, and an injection level is provided in the injection layer, light is generated by emission transition using the first and second upper levels and the lower level in the emission layer, and by the injection level in the injection layer, electrons after the emission transition are injected into the emission layer of a next period, and the energy interval between the first upper level and the second upper level is set to be smaller than the energy of an LO phonon, and the layer thickness of the exit barrier layer from the emission layer to the injection layer is set in a range not less than 70% and not more than 150% of the layer thickness of the injection barrier layer, and accordingly, a novel light emitting device using polaritons, capable of performing a light emitting operation by current injection, is realized.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 5 includes schematic diagrams showing emission transition using polaritons in the active layer of the semiconductor light emitting device.

FIG. 8 includes graphs showing wavenumber dependence of Hopfield coefficients $\beta$ for electron excitation.

FIG. 10 is a diagram showing an example of a configuration of a unit laminate structure constituting an active layer.

FIG. 11 is a chart showing an example of a structure of a unit laminate structure of one period in the active layer.

DESCRIPTION OF THE PREFERRED EMBODIMENTS

Figure 1:
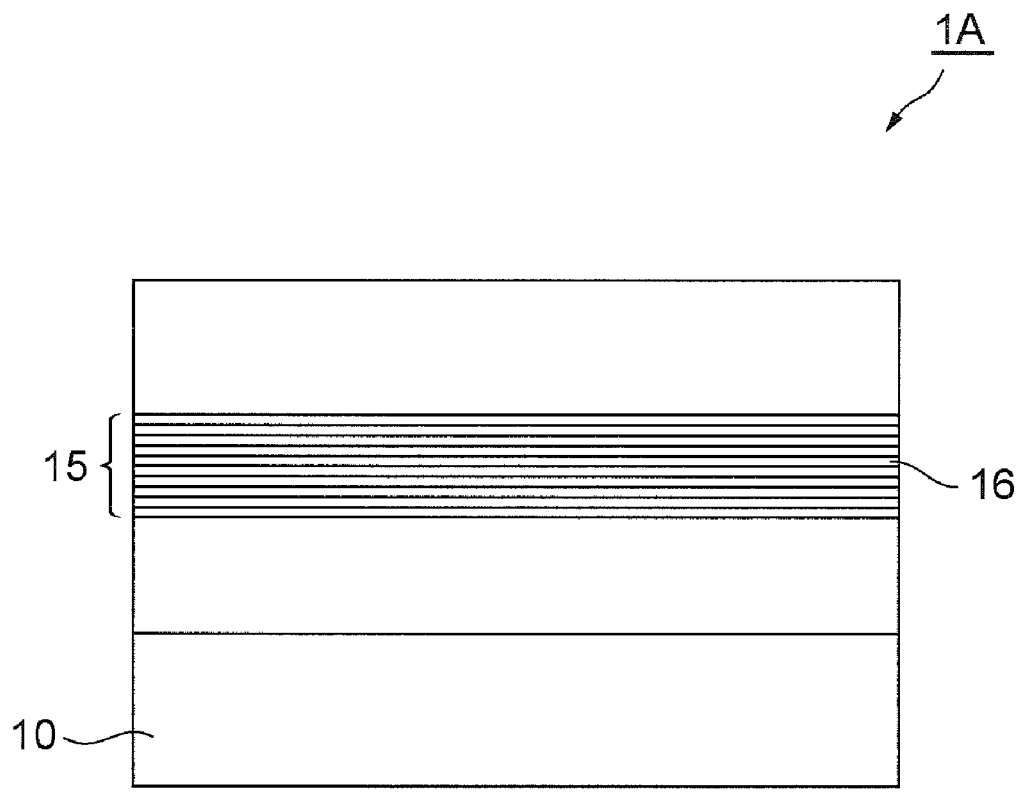
FIG. 1 is a view schematically showing a basic configuration of a semiconductor light emitting device.

Hereinafter, preferred embodiments of a semiconductor light emitting device according to the present invention will be described in detail with reference to the drawings. In the description of the drawings, the same components are attached with the same reference symbols, and overlapping description will be omitted. Moreover, the dimensional ratios in the drawings are not always equal to those in the description.

FIG. 1 is a view schematically showing a basic configuration of a semiconductor light emitting device according to the present invention. A semiconductor light emitting device 1A of the present embodiment is a monopolar type light emitting device which generates light by emission transition using a subband level structure in a semiconductor quantum well structure. This light emitting device 1A is especially configured as a novel semiconductor light emitting device using polaritons, and the emission structure thereof is characterized by a polariton generation structure with high efficiency and a structure which creates a ground state for causing aggregation of polaritons.

The semiconductor light emitting device 1A shown in FIG. 1 includes a semiconductor substrate 10 and an active layer 15 formed on the semiconductor substrate 10. The active layer 15 has a cascade structure including alternate and multistage lamination of quantum well emission layers to be used for generation of light and electron injection layers to be used for injection of electrons into the emission layer.

In detail, a semiconductor laminated structure including a quantum well emission layer and an injection layer is defined as a unit laminate structure 16 of one period, and by multistage-laminating the unit laminate structures 16, the active layer 15 having a cascade structure is formed. The number of laminations of the unit laminate structures 16 each including the quantum well emission layer and the injection layer is properly set, and for example, set to approximately several hundred. Moreover, the active layer 15 is formed on the semiconductor substrate 10 directly or via another semiconductor layer.

Figure 2:
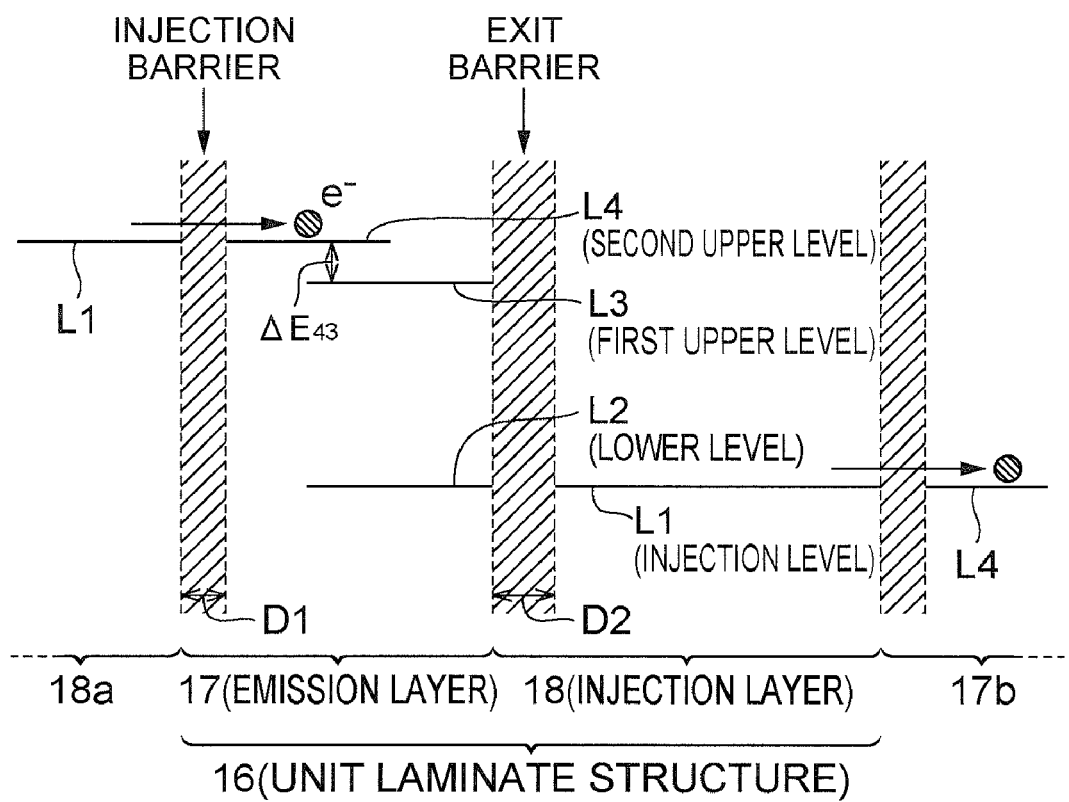
FIG. 2 is a diagram showing a subband level structure in an active layer of the semiconductor light emitting device shown in FIG. 1.

FIG. 2 is a diagram showing a subband level structure in the active layer of the semiconductor light emitting device shown in FIG. 1. As shown in FIG. 2, each of the plurality of unit laminate structures 16 included in the active layer 15 consists of the quantum well emission layer 17 and the electron injection layer 18. The emission layer 17 and the injection layer 18 are respectively formed so as to have a predetermined quantum well structure including the quantum well layers and quantum barrier layers. Accordingly, in the unit laminate structure 16, a subband level structure as an energy level structure formed by the quantum well structure is formed.

In detail, the emission layer 17 includes, in order from the injection layer 18a side of the unit laminate structure of the preceding stage, first to n-th barrier layers (n is an integer of 2 or more) and first to n-th well layers, the layer closest to the injection layer 18a side is defined as the first barrier layer, and the barrier layers and the well layers are alternately laminated. Moreover, the first barrier layer in the quantum well emission layer 17 is configured as an injection barrier layer for electrons to be injected from the injection layer 18a of the preceding stage into the emission layer 17.

The injection layer 18 includes, in order from the emission layer 17 side of the same stage, first to m-th barrier layers (m is an integer of 2 or more) and first to m-th well layers, the layer closest to the emission layer 17 side is defined as the first barrier layer, and the barrier layers and the well layers are alternately laminated. Moreover, the first barrier layer in the electron injection layer 18 is configured as an exit barrier layer for electrons to exit from the emission layer 17 to the injection layer 18.

The unit laminate structure 16 constituting the active layer 15 in the light emitting device 1A of the present embodiment has, as shown in FIG. 2, in its subband level structure, a first upper level L3, a second upper level L4 which is an energy level higher than the first upper level, and a lower level L2 which is an energy level lower than the first upper level, as levels formed in the emission layer 17 and relating to light emission. Further, the unit laminate structure has an injection level L1 as a level formed in the injection layer 18.

The injection level L1 in the injection layer 18 is a level for transporting electrons tunnel-extracted from the lower level L2 via the exit barrier layer and injecting the electrons into the second upper level L4 in the emission layer 17b of the subsequent stage. Therefore, the injection level L1 is set to energy substantially equal to that of the lower level L2 in the emission layer 17. Moreover, as the injection level L1, a single level may be used or a plurality of levels may be used.

Electrons e⁻ from the injection level L1 are tunnel-injected into the second upper level L4 in the emission layer 17 due to a resonant tunneling effect via the injection barrier layer. In the emission layer 17, light is generated by emission transition using the subband level structure formed by the second upper level L4, the first upper level L3, and the lower level L2. Further, electrons after the emission transition are injected from the lower level L2 into the second upper level L4 in the emission layer 17b of the subsequent stage via the injection level L1 in the injection layer 18. In particular, the light emitting device 1A of the present embodiment is configured so as to realize the emission transition in the emission layer 17 by generation and transition of polaritons in the active layer 15.

Specifically, in the level structure shown in FIG. 2, the energy interval $\Delta E_{43}$ between the first upper level L3 and the second upper level L4 is set to be smaller than the energy $E_{LO}$ of an LO phonon ($\Delta E_{43} < E_{LO}$). Accordingly, ultrahigh-speed relaxation of electrons from the level L4 to the level L3 due to LO phonon scattering is prohibited, and electrons injected into the level L4 can be prevented from relaxing to the level L3 without contributing to generation of a polariton for emission transition. Here, for example, the quantum well structure is made of InGaAs/InAlAs, the energy of the LO phonon is $E_{LO} = 34$ meV.

In the light emitting device 1A of the present embodiment, in detail, as described later, a polariton is generated by electron-electron interaction between an electron injected into the second upper level L4 and an electron present in the lower level L2, and by using state transition of the polariton, light generation can be realized without forming a population inversion. Therefore, to easily cause the electron-electron interaction, electrons must be made present at the lower level L2 in the emission layer 17 at a high density.

For this, in the present light emitting device 1A, the exit barrier layer at the exit side of the emission layer 17 is formed to be thick. Specifically, the layer thickness D2 of the exit barrier layer is set in a range not less than 70% and not more than 150% of the layer thickness D1 of the injection barrier layer ($D1 \times 0.7 \leq D2 \leq D1 \times 1.5$). Accordingly, the tunneling time $\tau_{tun}$ of electrons from the emission layer 17 to the injection layer 18 via the exit barrier layer becomes longer, and therefore, conditions for high-density presence of electrons at the lower level L2 can be realized. At this time, a polariton (4-2 polariton by the levels L4 and L2) is generated by the above-described electron-electron interaction. Further, state transition of the polariton functions as emission transition and generates light.

By repeating such electron injection, generation of a polariton by electron-electron interaction, and emission transition in the plurality of unit laminate structures 16 of the active layer 15, light is generated in a cascade manner in the active layer 15. That is, by alternately laminating many emission layers 17 and injection layers 18, electrons successively move through the laminate structures 16 in a cascade manner, and light hv is generated at the time of emission transition in each laminate structure 16. Moreover, when the light emitting device 1A is configured as a laser device having a resonator structure, by resonating light generated as described above by an optical resonator, a laser beam with a predetermined wavelength is generated.

Effects of the semiconductor light emitting device 1A of the present embodiment will be described.

In the semiconductor light emitting device 1A shown in FIG. 1 and FIG. 2, as the basic structure of the active layer 15, a cascade structure in which unit laminate structures 16 each including an emission layer 17 and an injection layer 18, respectively including a plurality of quantum barrier layers and well layers, are multistage-laminated is adopted. This cascade structure is conventionally used in a quantum cascade laser.

In this light emitting device 1A, in the subband level structure in the unit laminate structure 16 of the active layer 15, as shown in FIG. 2, the emission layer 17 is provided with a first upper level L3, a second upper level L4 of an energy higher than that of the first upper level, and a lower level L2, and the injection layer 18 is provided with an injection level L1. Accordingly, a configuration is realized in which light is generated by emission transition using the first and second upper levels L3 and L4 and the lower level L2 in the emission layer 17, and electrons after the emission transition in the emission layer 17 are injected into the emission layer 17b of a next period via the injection level L1 in the injection layer 18.

Moreover, in this level structure, the energy interval $\Delta E_{43}$ between the first upper level L3 and the second upper level L4 is set to be smaller than the energy $E_{LO}$ of an LO phonon. Accordingly, electrons e⁻ injected from the injection level L1 of the preceding stage into the second upper level L4 are prohibited from relaxing at a high speed to the first upper level L3 due to LO phonon scattering without contributing to polariton generation and succeeding emission transition.

Further, the layer thickness D2 of the exit barrier layer from the emission layer 17 to the injection layer 18 is set in a range not less than 70% and not more than 150% of the layer thickness D1 of the injection barrier layer. By thus setting the layer thickness of the exit barrier layer to be thicker than, for example, that in the configuration of an ordinary quantum cascade laser, etc., the tunneling time $\tau_{tun}$ of electrons from the lower level L2 in the emission layer to the injection level L1 in the injection layer becomes longer, and electrons are present at the lower level L2 at a high density.

In this configuration, due to electron-electron interaction between an electron at the second upper level L4 which is prohibited from relaxing at a high speed and an electron at the lower level L2 whose tunneling time to the injection layer is set to be longer, a polariton is generated. Then, a phenomenon such as transition of the polariton to another polariton state acts as emission transition in the subband level structure in the emission layer 17, and accordingly, without forming a population inversion between the upper level and the lower level, light is generated in the emission layer 17 due to a light emission phenomenon using polaritons. According to the above-described configuration and action, a semiconductor light emitting device 1A capable of performing a light emitting operation by current injection and using polaritons is realized.

Figure 3:
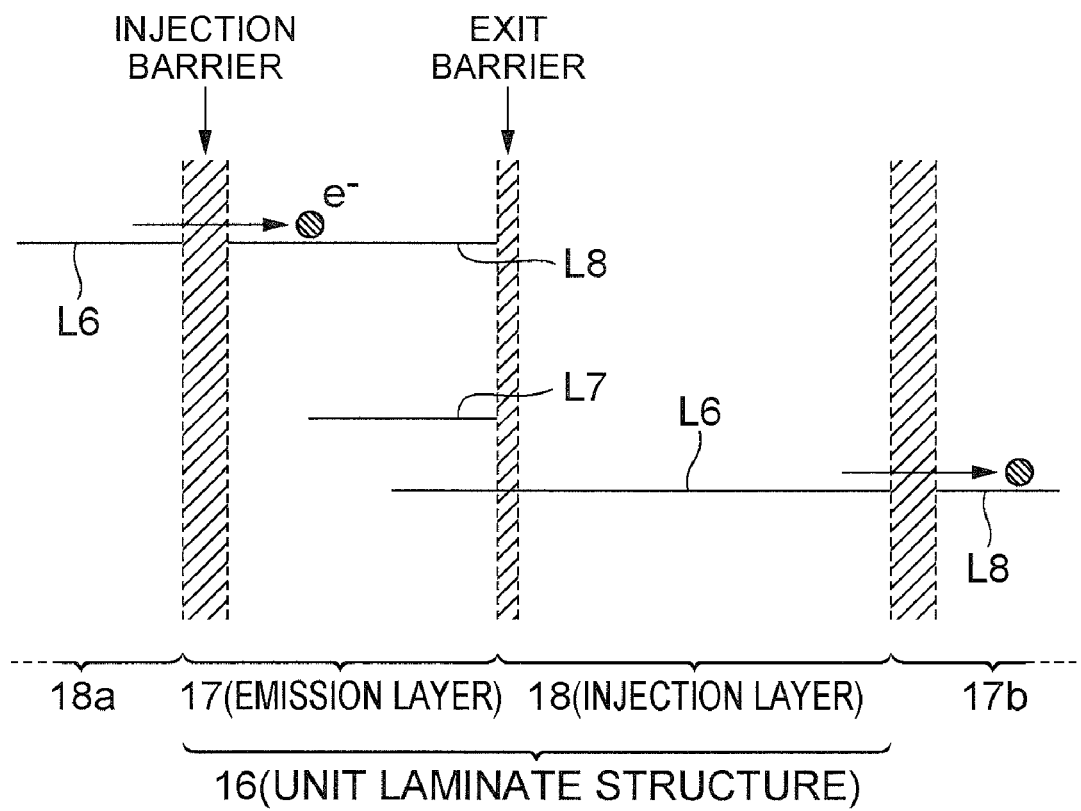
FIG. 3 is a diagram showing a subband level structure in an active layer of a conventional semiconductor light emitting device.

Here, FIG. 3 is a diagram showing a subband level structure in an active layer of a quantum cascade laser which is a conventional semiconductor light emitting device. In the structure shown in FIG. 3, in the subband level structure of the unit laminate structure 16, an upper level L8 and a lower level L7 relating to light emission and a relaxation level L6 to be used for relaxation of electrons are provided. In this level structure, light is generated by intersubband transition from the upper level L8 to the lower level L7.

In addition, the exit barrier layer from the emission layer 17 to the injection layer 18 has a layer thickness set sufficiently thinner than the layer thickness of the injection barrier layer. In this case, electrons after intersubband emission transition relax from the lower level L7 to the relaxation level L6 through a relaxation process such as LO phonon scattering, and are injected into the emission layer 17b of the next period via the injection layer 18. In this configuration, while a population inversion is formed between the upper level L8 and the lower level L7, polaritons are not generated.

On the other hand, in the subband level structure shown in FIG. 2, the second upper level L4, the first upper level L3, and the lower level L2 are provided in the emission layer 17, the injection level L1 is provided in the injection layer 18, the energy interval $\Delta E_{43}$ between the levels L4 and L3 is set smaller, and in comparison with the layer thickness D1 of the injection barrier layer, the layer thickness D2 of the exit barrier layer is set to be thicker than ordinary. Accordingly, as described above, the light emitting operation using polaritons becomes possible. This light emitting device does not need formation of a population inversion, so that a laser device which operates with a lower threshold and lower power consumption can be realized. This laser device is also effective in the aspect of application to elements such as application to field measurement by mounting in a portable measuring device.

The subband level structure described above can be controlled by the design of the quantum well structure in the unit laminate structure 16 constituting the active layer 15. Moreover, in emission transition using polaritons, the emission energy hν corresponds to the energy interval between the first upper level L3 and the lower level L2. Ordinarily, the emission energy is slightly smaller than the energy interval between the first upper level L3 and the lower level L2. Therefore, even in the light emitting device 1A using polaritons, the emission energy (emission wavelength) can be controlled by adjusting the energy interval between the levels L3 and L2.

In the light emitting device 1A configured as described above, it is preferable that, in the emission transition in the quantum well emission layer 17, specifically, due to electron-electron interaction between an electron injected into the second upper level L4 and an electron present in the lower level L2, a 4-2 polariton (polariton by the levels L4 and L2, dark polariton) is generated, and the 4-2 polariton relaxes to a 3-2 polariton (polariton by the levels L3 and L2, bright polariton) mediated by the first upper level L3 by inter-polariton transition by means of an LO phonon, and accordingly, light is generated.

According to this light emission process using inter-polariton transition, generation of light by polariton generation and transition in the active layer 15 can be preferably realized. Moreover, a bright 3-2 polariton generated as described above propagates inside the semiconductor lamination structure of the light emitting device 1A and reaches the device surface, and is accordingly converted into a photon with the same frequency and emitted to the outside.

Concerning the configuration of thickening the exit barrier layer in the lamination structure of the unit laminate structure 16, more specifically, the layer thickness D2 of the exit barrier layer is preferably set so that the tunneling time $\tau_{tun}$ of electrons from the lower level L2 in the emission layer 17 to the injection level L1 in the injection layer 18 becomes longer than the relaxation time $\tau_{32}$ of electrons from the first upper level L3 to the lower level L2 in the emission layer 17 ($\tau_{32} < \tau_{tun}$). Accordingly, electrons present at the lower level become sufficiently high in density, and the efficiencies of generation of a polariton caused by interaction between an electron in the second upper level L4 and an electron in the lower level L2 and succeeding emission transition can be improved.

Figure 4:
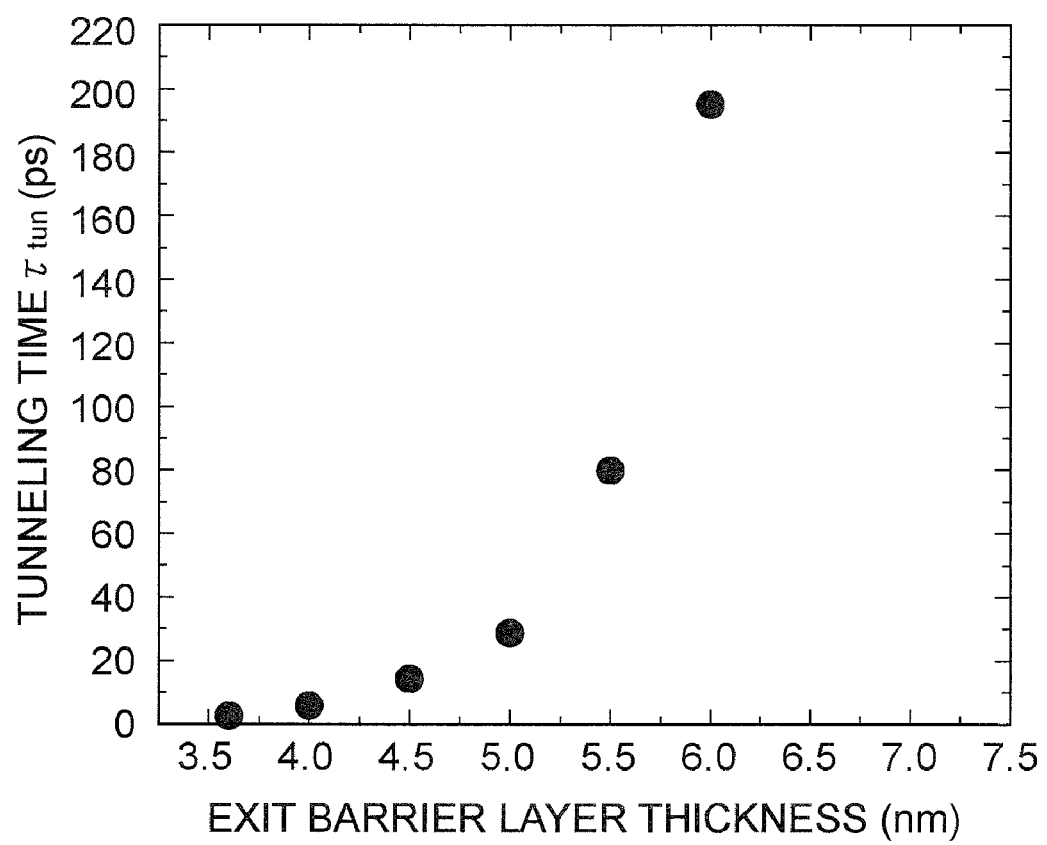
FIG. 4 is a graph showing exit barrier layer thickness dependence of a tunneling time of electrons from an emission layer to an injection layer.

FIG. 4 is a graph showing exit barrier layer thickness dependence of the tunneling time of electrons from the emission layer 17 to the injection layer 18. In this graph, the horizontal axis indicates the layer thickness D2 (nm) of the exit barrier layer, and the vertical axis indicates the tunneling time $\tau_{tun}$ (ps) of electrons via the exit barrier layer. In addition, in this calculation example, the configuration shown in FIG. 10 and FIG. 11 described later is assumed as the lamination structure of the active layer. In this configuration example, the layer thickness of the injection barrier layer is D1=4.5 nm.

As shown in the graph of FIG. 4, by thickening the exit barrier layer, the tunneling time $\tau_{tun}$ becomes longer. For example, when the exit barrier layer thickness is D2=3.6 nm (D2/D1=80%), the tunneling time is approximately 2.6 ps. Moreover, as the exit barrier layer thickness D2 is increased, the tunneling time $\tau_{tun}$ rapidly increases, and when the layer thickness is D2=4.5 nm, the tunneling time becomes approximately 14 ps, and when D2=6.0 nm, the tunneling time becomes approximately 200 ps.

Here, in ordinary quantum cascade lasers, in many cases, the layer thickness D2 of the exit barrier layer is approximately 30 to 50% ($\tau_{tun}$<1 ps) of the layer thickness D1 of the injection barrier layer. On the other hand, in the above-described light emitting device 1A using polaritons in emission transition, as long as the layer thickness D2 of the exit barrier layer is not less than 70% of the layer thickness D1 of the injection barrier layer, the tunneling time satisfies the above-described condition of $\tau_{32} < \tau_{tun}$, or an operation condition close to this is obtained. On the other hand, the upper limit of the layer thickness D2 of the exit barrier layer must be in a range in which a current necessary for the light emitting operation flows. Considering data shown in FIG. 4, etc., the layer thickness D2 of the exit barrier layer is preferably not more than 150%, more preferably, not more than 100% of the layer thickness D1 of the injection barrier layer.

In the unit laminate structure 16 including the emission layer 17 and the injection layer 18, the injection layer 18 is preferably doped with an n-type impurity so that the carrier density falls within the range not less than $5 \times 10^{17}$ cm$^{-3}$ and not more than $1 \times 10^{19}$ cm$^{-3}$. By thus setting the carrier density high in the injection layer 18, electrons as carriers can be sufficiently supplied to the semiconductor quantum well structure of the active layer 15, and the efficiencies of generation of a polariton caused by electron-electron interaction and succeeding emission transition can be further improved. As an example of this configuration, InGaAs/InAlAs is doped with Si that is an n-type impurity at a carrier concentration of $1 \times 10^{18}$ cm$^{-3}$.

The light emitting device 1A using polaritons and configured as described above can be used as, for example, a light emitting device similar to an LED, etc. When the above-described light emitting device 1A is used in an LED mode, aggregation of polaritons is not necessary, and a resonator which makes a photon lifetime equivalent to or not more than the polariton relaxation time (for example, a short resonator with a resonator length of not more than several hundred micrometers) is used.

Alternatively, the above-described light emitting device 1A may be configured as a semiconductor laser device (polariton laser) which outputs coherent light by being provided with an optical resonator structure. In this case, to extract coherent light, a ground state where coherent polaritons aggregate must be prepared. Exciton-polaritons using conventional interband transition respond to a TE mode of light, so that the ground state can be prepared by the above-described surface-emitting microcavity structure. On the other hand, in a configuration using intersubband transition, due to responsiveness to a TM mode of light, the conventional micro resonator structure cannot be used.

Concerning a resonator structure in the light emitting device using intersubband transition, the light emitting device 1A can be configured as a laser device including a guide layer which is formed on one surface of the active layer, and a cladding layer which is formed on a surface of the guide layer on a side opposite to the active layer, and has a diffraction grating formed on an interface with the guide layer, and having a distributed feedback (DFB) type resonator structure using the diffraction grating. When the light emitting device 1A configured as described above is configured as a laser device, this distributed feedback (DFB) type structure can be preferably used as a resonator structure thereof.

When using a DFB structure as described above, to efficiently aggregate polaritons, a wide stop band width is necessary. Therefore, a DFB structure having a coupling coefficient $\kappa$ (for example, $\kappa > 100$ cm$^{-1}$) much higher than in ordinary DFB lasers is preferably provided. To thus increase the coupling coefficient $\kappa$ of the DFB structure, it is possible that a diffraction grating with deeper depression and protrusion is formed for increasing the refractive index difference, or a configuration which makes the diffraction grating forming region close to the active layer is used.

The requirement for this high coupling coefficient $\kappa$ can be regarded as equivalent to requirement for a high Q-value in the micro resonator structure. In addition, the resonator structure to be applied to the light emitting device of the above described configuration is not limited to the DFB type resonator structure, but may be other structures for example, such as a Fabry-Perot (FP) type resonator structure and a ring-type resonator structure.

Emission transition using polaritons in the light emitting device 1A configured as described above will be described in detail with reference to FIG. 5 to FIG. 8.

FIG. 5 includes schematic diagrams showing emission transition using polaritons in the active layer of the semiconductor light emitting device. Here, in the graph (a) of FIG. 5, the horizontal axis indicates the wavenumber k and the vertical axis indicates the energy E to show the second upper level L4 and the lower level L2 relating to generation of a polariton in the emission layer 17. Moreover, similarly in the graph (b) of FIG. 5, the horizontal axis indicates the wavenumber k and the vertical axis indicates the energy E to schematically show polariton dispersion curves A1, A2, and A3 and inter-polariton transition functioning as emission transition.

In the light emitting device 1A shown in FIG. 1 and FIG. 2, as described above, by collective high-speed scattering (collective excitation) through electron-electron interaction between an electron injected into the second upper level L4 and an electron present in the lower level L2, a 4-2 polariton with the levels L4 and L2 is generated. When the level L4 is regarded as the initial state and the level L2 is regarded as the final state, the generation process of the 4-2 polariton by electron-electron scattering can be interpreted, as shown in FIG. 5(a), as generation of a polariton state by absorbing a photon by emitted by emission transition between the levels L4 and L2 and taking the energy of the photon.

However, in this process, the actual rate of photon emission is small, and electron-electron scattering occurring at a high speed in subbands is dominant. Therefore, the 4-2 polariton generated in this process is, as shown in FIG. 5(b), a dark polariton with an electron excitation component being dominant. For the 4-2 polariton, inter-polariton transition via a LO phonon is quantum-mechanically allowed. That is, transition and relaxation from the dark 4-2 polariton to the 3-2 polariton with the levels L3 and L2 by emitting the LO phonon are possible. In this transition process, a bright polariton with a photon component being dominant contributing to light emission is generated by holding a photon.

Here, a graph G0 shown by dashed line in FIG. 5(b) shows the dependence of the energy of a photon on wavenumber. Moreover, a graph G3 shows the dependence of the energy of an electron corresponding to the first upper level L3 on wavenumber. In addition, a graph G4 shows the dependence of the energy of an electron corresponding to the second upper level L4 on wavenumber. A polariton formed by coupling between the electron system and the photon system can assume the states on the dispersion curves shown as A1 to A3, and, departing from the graph G0 of the photon system, the photon component decreases and the electron excitation component increases. Moreover, departing from the graphs G3 and G4 of the electron system, the electron excitation component decreases and the photon component increases.

The 4-2 polariton generated by electron-electron scattering is generated as a dark polariton in a region which departs from the graph G0 of the photon system and in which the electron excitation component is dominant as schematically shown by the black circles in the figure. Then, the dark 4-2 polariton emits an LO phonon and transits to the 3-2 polariton.

In this inter-polariton transition to the 3-2 polariton, as shown by the white circle in the figure, transition to a region which separates by the energy of the LO phonon from the 4-2 polariton and close to the graph G0 in which the photon component is dominant is possible, and accordingly, light can be generated. This polariton transition structure can be controlled by the design of the subband level structure as shown in FIG. 2. Moreover, the energy of a photon held by a polariton according to interaction at the time of the inter-polariton transition, that is, energy of light generated by the inter-polariton transition is slightly smaller than the energy interval $\Delta E_{32}$ between the levels L3 and L2.

The polariton dispersion curves shown in FIG. 5 and the states of polaritons on the curves will be described further with reference to detailed calculation examples. Here, in the following description, the subscripts 2, 3, and 4 correspond to the lower level L2, the first upper level L3, and the second upper level L4 in the level structure shown in FIG. 2, respectively.

In the subband level structure shown in FIG. 2, Hamiltonian $H=H_0+H_{int}$ is expressed by the following formula.

$$H = [E_2 c_2^\dagger c_2 + E_3 c_3^\dagger c_3 + E_4 c_4^\dagger c_4 + \hbar \omega a^\dagger a] +$$
$$[\hbar \Omega_{32}(c_3^\dagger c_2 a + c_2^\dagger c_3 a^\dagger) + \hbar \Omega_{42}(c_4^\dagger c_2 a + c_2^\dagger c_4 a^\dagger)]$$
$$= H_0 + H_{int}$$

Here, in the formula given above,
$E_2, E_3, E_4$: energy of electron
$\hbar \omega$: energy of photon
$c^\dagger, c$: creation-annihilation operator of electron
$a^\dagger, a$: creation-annihilation operator of photon
$\Omega$: Rabi oscillation frequency
Moreover, $H_{int}$ shows an interaction term of Hamiltonian.

The state vector S of a polariton is expressed as:

$$|S\rangle = (\alpha a^\dagger + \beta_{32} c_3^\dagger c_2 + \beta_{42} c_4^\dagger c_2)|1\rangle_2 |0\rangle_3 |0\rangle_4 |0\rangle_{photon}$$

In this state vector S, a state where an electron is present at the lower level L2 is the ground state. Moreover, in the formula given above, $\alpha$ indicates the Hopfield coefficient for photon, and $\beta$ indicates the Hopfield coefficient for electron excitation.

When the Hamiltonian H is applied to the above-described state vector S, the following is obtained:

$$H|S\rangle = (H_0 + H_{int})|S\rangle = \epsilon |S\rangle$$

Here, the state |S> indicates an eigenstate of H, and $\epsilon$ indicates an eigenenergy of a polariton. Moreover, by summarizing these, the following eigenvalue equation is obtained:

$$(\hbar\omega - \epsilon)(E_{32} - \epsilon)(E_{42} - \epsilon) - |\hbar\Omega_{32}|^2(E_{42} - \epsilon) - |\hbar\Omega_{42}|^2(E_{32} - \epsilon) = 0$$

This eigenvalue equation is expressed as follows.

$$\left(\frac{\epsilon}{E_{32}}\right)^3 - \left(1 + \frac{E_{42}}{E_{32}} + \frac{\hbar\omega}{E_{32}}\right)\left(\frac{\epsilon}{E_{32}}\right)^2 +$$
$$\left\{\frac{E_{42}}{E_{32}} + \left(1 + \frac{E_{42}}{E_{32}}\right)\left(\frac{\hbar\omega}{E_{32}}\right) - \left|\frac{\hbar\Omega_{32}}{E_{32}}\right|^2 - \left|\frac{\hbar\Omega_{42}}{E_{32}}\right|^2\right\}\left(\frac{\epsilon}{E_{32}}\right) -$$
$$\left\{\frac{E_{42}}{E_{32}}\left(\frac{\hbar\omega}{E_{32}}\right) - \left|\frac{\hbar\Omega_{32}}{E_{32}}\right|^2\left(\frac{E_{42}}{E_{32}}\right) - \left|\frac{\hbar\Omega_{42}}{E_{32}}\right|^2\right\} = 0$$

This equation is a cubic equation of $\epsilon$, so that three solutions are obtained for a certain energy of photon.

Here, when $C_0$ is the light speed, n is the refractive index, and k is the wavenumber, the energy of a photon is expressed as:

$$\hbar\omega = \hbar\left(\frac{C_0}{n}\right)k$$

Therefore, three polariton eigenenergies are obtained for a certain value of the wavenumber k corresponding to the energy of a photon.

Figure 6:
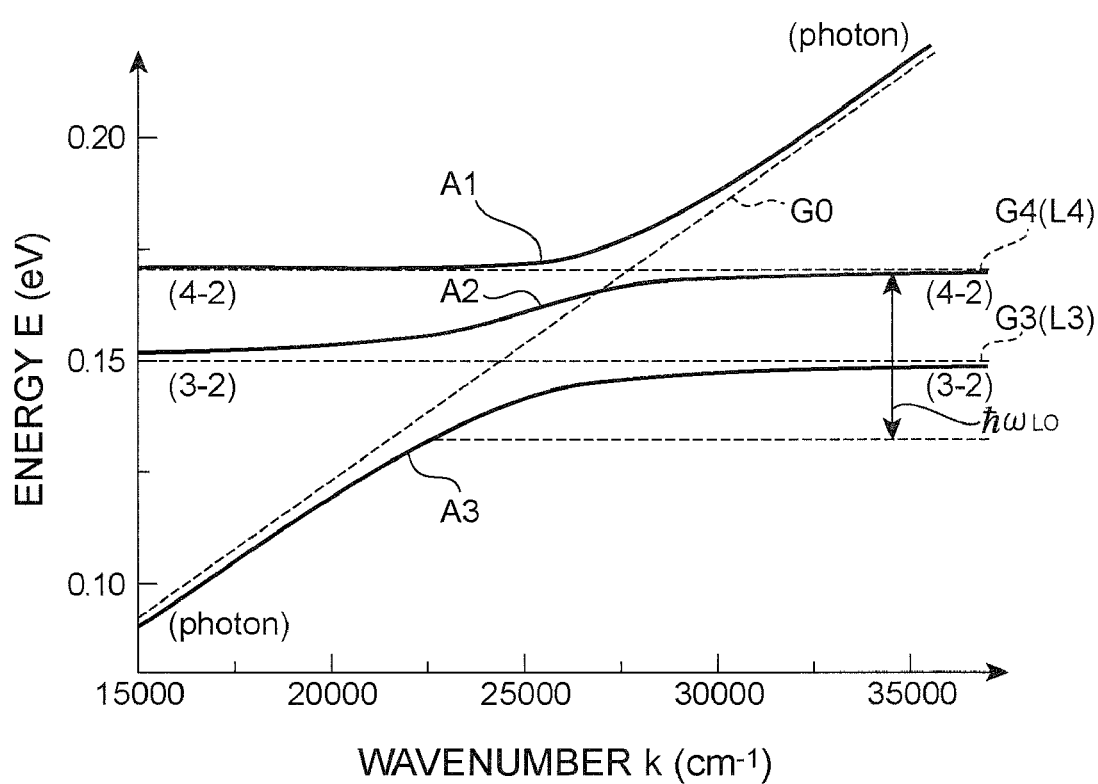
FIG. 6 is a graph showing dispersion curves of a polariton.

FIG. 6 shows polariton dispersion curves obtained through the above-described calculation. Here, the horizontal axis indicates the wavenumber k, and three dispersion curves A1, A2, and A3 obtained by obtaining the energies $\epsilon$ at the respective points of wavenumbers according to the equation given above are shown. Here, as described above concerning the schematic diagram of FIG. 5(b), the graph G0 indicates the energy of an isolated photon without interaction. Moreover, the graphs G3 and G4 show the energies of an isolated electron corresponding to the levels L3 and L4. On the other hand, the dispersion curves A1 to A3 show the energies E of a polariton with respect to the wavenumbers k when the electron system and the photon system interact with each other.

In the graph of FIG. 6, the horizontal axis indicates the wavenumber k, and corresponds to the energy E and the wavelength $\lambda$ of a photon with one-to-one correspondence. Therefore, the horizontal axis can be considered as corresponding to the emission wavelength. Moreover, the wavenumber k of 20000 to 25000 $cm^{-1}$ corresponds to approximately 8 to 10 $\mu m$ when it is converted into the wavelength $\lambda$. This wavelength range is the emission wavelength band of the light emitting device assumed in the configuration example described above.

Figure 7:
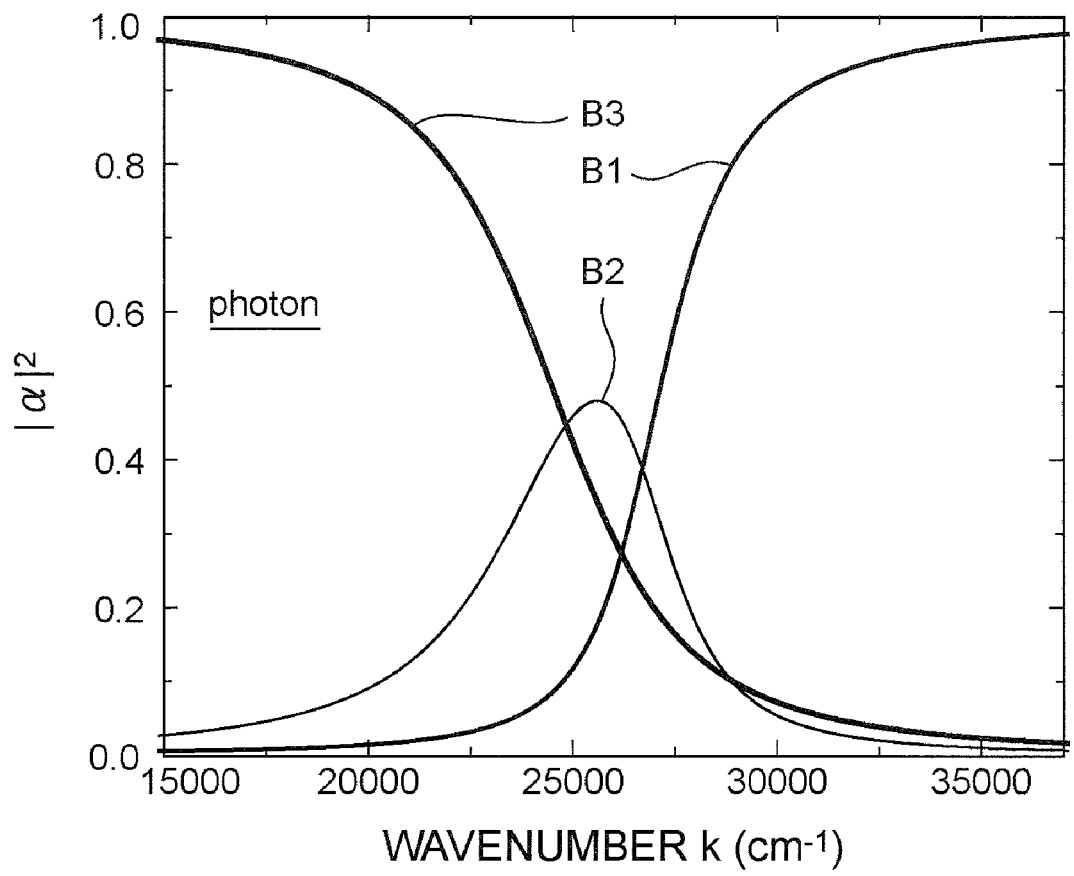
FIG. 7 is a graph showing wavenumber dependence of Hopfield coefficient $\alpha$ for a photon.

In the polariton dispersion curves described above, the Hopfield coefficient $\alpha$ for a photon and Hopfield coefficients $\beta_{32}$ and $\beta_{42}$ for electron excitation are obtained as follows.

$$\beta_{32} = \left(\frac{\hbar\Omega_{32}}{\epsilon - E_{32}}\right)\alpha, \quad \beta_{42} = \left(\frac{\hbar\Omega_{42}}{\epsilon - E_{42}}\right)\alpha$$
where $|\alpha|^2 + |\beta_{32}|^2 + |\beta_{42}|^2 = 1$ Here, FIG. 7 is a graph showing the wavenumber dependence of the Hopfield coefficient $\alpha$ for a photon. Moreover, FIG. 8 includes graphs showing the wavenumber dependence of the Hopfield coefficients β for electron excitation.

The graph of FIG. 7 shows the dependence of the square $|\alpha|^2$ of the absolute value of the Hopfield coefficient for a photon on wavenumber. Moreover, in FIG. 7, the graphs B1, B2, and B3 show the values of $|\alpha|^2$ corresponding to the dispersion curves A1, A2, and A3 respectively. As shown by these graphs, on the dispersion curve A1 (graph B1), α~0 in the region with small wavenumbers, and α~1 in the region with large wavenumbers. In this case, as shown in FIG. 6, in the region with small wavenumbers, the dispersion curve A1 is asymptotic to the line G4 of the electron energy and the contribution of photon components becomes smaller, and in the region with large wavenumbers, the dispersion curve A1 is asymptotic to the line G0 of photon energy and the contribution of photon components increases.

On the other hand, on the dispersion curve A3 (graph B3), contrary to the dispersion curve A1, α~1 in the region with small wavenumbers, and α~0 in the region with large wavenumbers. Moreover, the dispersion curve A2 (graph B2) is a superposition of the dispersion curves A1 and A3, so that the value becomes maximum $|\alpha|^2 \sim 1/2$) in the wavenumber middle region on this dispersion curve.

The graph (a) of FIG. 8 shows the dependence of the square $|\beta_{32}|^2$ of the absolute value of the Hopfield coefficient for electron excitation on wavenumber. Moreover, in FIG. 8(a), the graphs C1, C2, and C3 show the values of $|\beta_{32}|^2$ corresponding to the dispersion curves A1, A2, and A3 respectively. The contribution of this $\beta_{32}$ to the dispersion curve A1 (graph C1) is small. On the dispersion curve A3 (graph C3), contrary to α, $\beta_{32}$~0 (contribution of electron excitation components is small) in the region with small wavenumbers, and $\beta_{32}$~1 (contribution of electron excitation components is large) in the region with large wavenumbers. On the other hand, on the dispersion curve A2 (graph C2), contrary to the dispersion curve A3, $\beta_{32}$~1 in the region with small wavenumbers, and $\beta_{32}$~0 in the region with large wavenumbers.

The graph (b) of FIG. 8 shows the dependence of the square $\beta\beta_{42}|^2$ of the absolute value of the Hopfield coefficient for electron excitation on wavenumber. Moreover, in FIG. 8(b), the graphs D1, D2, and D3 show the values of $|\beta_{42}|^2$ corresponding to the dispersion curves A1, A2, and A3 respectively. This $\beta_{42}$ has almost no contribution to the dispersion curve A3 (graph D3). On the dispersion curve A1 (graph D1), contrary to α, $\beta_{42}$~1 in the region with small wavenumbers, and $\beta_{42}$~0 in the region with large wavenumbers. On the other hand, on the dispersion curve A2 (graph D2), contrary to the dispersion curve A1, $\beta_{42}$~0 in the region with small wavenumbers, and $\beta_{42}$~1 in the region with large wavenumbers.

Summarizing these, in FIG. 6, on the dispersion curve A2, the contribution of the photon system (a) becomes maximum around the cross point, and departing from the cross point, the contribution of the electron system ($\beta_{32}$) by the levels L3 and L2 is larger in the region with small wavenumbers, and the contribution of the electron system ($\beta_{42}$) by the levels L4 and L2 is larger in the region with large wavenumbers. Moreover, on the dispersion curve A1, the contribution of the electron system ($\beta_{42}$) by the levels L4 and L2 is larger in the region with small wavenumbers, and the contribution of the photon system (a) is larger in the region with large wavenumbers. In addition, on the dispersion curve A3, the contribution of the photon system (a) is larger in the region with small wavenumbers, and the contribution of the electron system ($\beta_{32}$) by the levels L3 and L2 is larger in the region with large wavenumbers.

According to the description given above, an electron injected into the second upper level L4 interacts with an electron in the lower level L2, and in the regions which are close to the graph G4 showing the electron system of the level L4 on the dispersion curves A1 and A2 shown in FIG. 5(b) and FIG. 6 and in which the $\beta_{42}$ component is dominant, a dark polariton is formed. Then, from this state, the polariton emits an LO phonon and relaxes to the region on the dispersion curve A3 separating by the energy of an LO phonon from the level L4. In this region, a bright polariton with the α component being dominant (α>$\beta_{32}$, $\beta_{42}$~0) is obtained. It is shown by the graphs in FIG. 7 and FIG. 8 that, on the dispersion curve A3, in the region of $|\alpha|^2$~0.7, $|\beta_{32}|^2$~0.3, and $|\beta_{42}|^2$~0 in which a ratio of photon components to electron excitation components is 7 to 3, a bright polariton contributing to light emission is generated.

Figure 9:
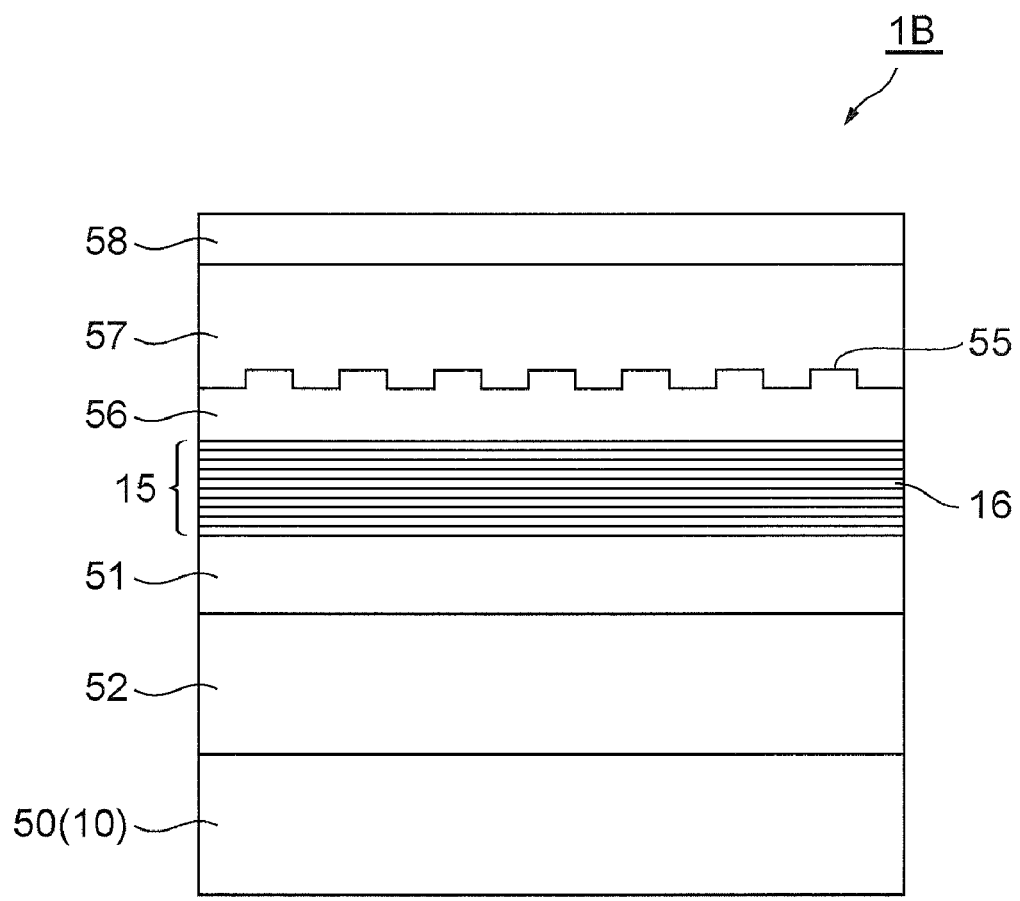
FIG. 9 is a view showing an example of a configuration of a semiconductor light emitting device.

The configuration of the semiconductor light emitting device of the present invention will be described in greater detail along with a detailed example of a device structure including a quantum well structure in the active layer. FIG. 9 is a view showing an example of the specific configuration of the semiconductor light emitting device. Moreover, FIG. 10 is a diagram showing an example of a configuration of the unit laminate structure constituting the active layer in the semiconductor light emitting device shown in FIG. 9.

In the quantum well structure of the active layer 15 in this configuration example, an example designed by setting the emission wavelength to approximately 8 μm is shown. FIG. 10 shows the quantum well structure and the subband level structure of a part of the multistage repetitive structure including the emission layers 17 and the injection layers 18 in the active layer 15. Moreover, the device structure shown in FIG. 9 and FIG. 10 can be formed by crystal growth according to, for example, the solid source MBE method, the gas source MBE method, or the MOCVD method.

In the semiconductor lamination structure of the semiconductor light emitting device 1B shown in FIG. 9, an n-type InP single crystal substrate 50 is used as the semiconductor substrate 10. Then, on this InP substrate 50, in order from the substrate side, a Si-doped InP lower cladding layer 52 with a thickness of 3.5 μm, a Si-doped InGaAs lower guide layer 51 with a thickness of 0.2 μm, an active layer 15 including multistage-laminated unit laminate structures 16, a Si-doped InGaAs upper guide layer 56 with a thickness of 0.2 μm, a Si-doped InP upper cladding layer 57 with a thickness of 3.5 μm, and a Si-doped InGaAs contact layer 58 with a thickness of 0.05 μm are successively laminated, and accordingly, the device structure of the semiconductor light emitting device 1B is formed.

In this lamination structure, the quantum well structure in the unit laminate structure 16 of the active layer 15 is formed by an InGaAs/InAlAs quantum well structure lattice-matched to the InP substrate 50. Moreover, at the interface between the upper guide layer 56 and the upper cladding layer 57, a diffraction grating 55 for a DFB type resonator structure is formed.

In the process of forming the diffraction grating 55, the diffraction grating can be formed by using the wet etching technique or dry etching technique, etc., as in the case of an ordinary semiconductor laser. Moreover, the end face mirror of the resonator can be formed by cleavage. The resonator length is preferably not more than several hundred micrometers. In addition, as the entire shape of the device 1B, for example, a ridge stripe structure can be used.

The active layer 15 in this configuration example is configured by laminating unit laminate structures 16 in series each including a quantum well emission layer 17 and an electron injection layer 18 with 30 periods. Moreover, the unit laminate structure 16 of one period is configured as a quantum well structure formed by alternately laminating eight quantum well layers 161, 162, and 181 to 186 and eight quantum barrier layers 171, 172, and 191 to 196 as shown in FIG. 10. Among these semiconductor layers, the quantum well layers are formed of InGaAs layers and the quantum barrier layers are formed of InAlAs layers.

In this unit laminate structure 16, concerning the emission layer 17 and the injection layer 18, in the lamination structure shown in FIG. 10, the lamination portion including two well layers 161 and 162 and barrier layers 171 and 172 functions as the emission layer 17. Moreover, the lamination portion including six well layers 181 to 186 and barrier layers 191 to 196 functions as the injection layer 18.

Among the semiconductor layers of the emission layer 17, the quantum barrier layer 171 of the first stage is positioned between the injection layer of the preceding stage and the emission layer 17, and serves as an injection barrier layer for electrons from the injection layer of the preceding stage to the emission layer 17. Similarly, among the semiconductor layers of the injection layer 18, the quantum barrier layer 191 of the first stage is positioned between the emission layer 17 and the injection layer 18, and serves as an exit barrier layer for electrons from the emission layer 17 to the injection layer 18. FIG. 11 shows an example of the detailed structure of the unit laminate structure 16 of one period in the active layer 15.

In this configuration, the unit laminate structure 16 has, in its subband level structure in the operation state shown in FIG. 10, the second upper level L4, the first upper level L3, and the lower level L2 in the emission layer 17, and the injection level L1 in the injection layer 18. In addition, a plurality of levels in the injection layer 18 correspond to the injection level L1 in this configuration example.

The second upper level L4 which accepts electrons from the injection layer of the preceding stage is designed so that its wave function is localized near the first well layer 161 to restrain leaking to other levels. The energy interval $\Delta E_{43}$ between the second upper level L4 and the first upper level L3 is approximately 20 meV, and is designed so as to become smaller than the energy of the LO phonon.

Transition between the first upper level L3 and the lower level L2 is transition in the same well layer 162. Moreover, the layer thickness of the exit barrier layer 191 on the exit side is set to be thick, the electron tunneling time satisfies the condition of $\rho_{32} < \tau_{tun}$, and electrons are accumulated in the lower level L2 relating to generation of a 4-2 polariton. In the configuration shown in the chart of FIG. 11, the layer thickness of the injection barrier layer 171 is D1=4.5 nm, the layer thickness of the exit barrier layer 191 is D2=3.6 nm, and the ratio of these is D2/D1=80%. In this case, in the configuration shown in FIG. 10 and FIG. 11, $\tau_{32}$=1.6 ps and $\tau_{tun}$=2.6 ps, and these satisfy the condition of $\tau_{32} < \tau_{tun}$.

In this level structure, the dipole moments of inter-subband transitions are $Z_{42}$=0.7 nm and $Z_{32}$=1.8 nm. Moreover, the injection layer 18 is configured so as to efficiently inject electrons into the second upper level L4 of the emission layer of the subsequent stage. In detail, the injection layer 18 is configured so that the well widths of the well layers 181 to 186 monotonically decrease to make the wave function concentrated toward the emission layer of the subsequent stage. In addition, the vicinity of the center of the injection layer 18 is doped with an n-type impurity at a high density for sufficiently supplying electrons which become carriers. In the configuration shown in FIG. 11, three semiconductor layers of the well layer 183, the barrier layer 194, and the well layer 184 in the vicinity of the center are doped with Si as an n-type impurity at a carrier density of $1 \times 10^{18}$ cm$^{-3}$.

Figure 12:
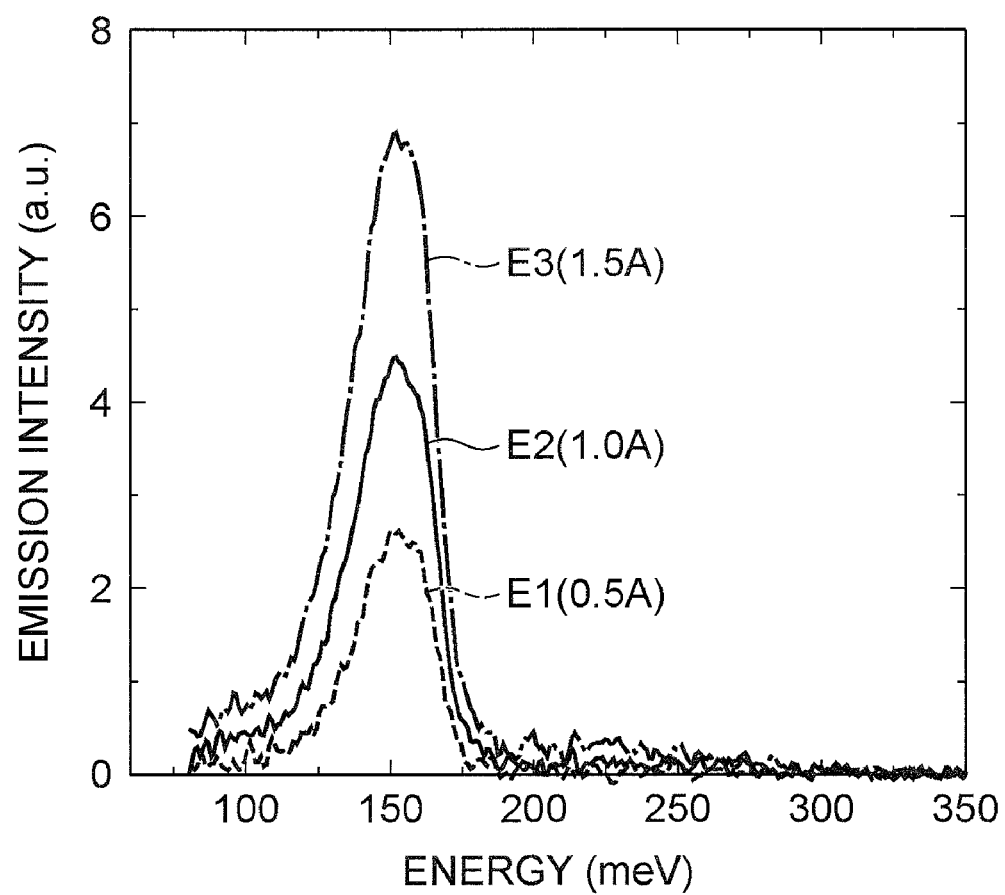
FIG. 12 is a graph showing emission spectra obtained with the semiconductor light emitting device.

FIG. 12 is a graph showing examples of emission spectra obtained with the semiconductor light emitting device configured as shown in FIG. 9 to FIG. 11. In this graph, the horizontal axis indicates the emission energy (meV), and the vertical axis indicates the emission intensity (a.u.). Moreover, the graphs E1, E2, and E3 show emission spectra in the case of operation at an operation temperature of 295K with currents of 0.5 A, 1.0 A, and 1.5 A, respectively. As shown by these graphs, in the light emitting device configured as described above, light emission using polaritons is obtained.

The semiconductor light emitting device of the present invention is not limited to the above-described embodiments and configuration examples, and can be modified in many ways. For example, in the configuration example described above, an InP substrate is used as a semiconductor substrate and the active layer is made of InGaAs/InAlAs, however, in detail, various configurations can be used as long as emission transition using polaritons in the quantum well structure is possible and the above-described subband level structure can be realized.

As this semiconductor material system, in addition to InGaAs/InAlAs described above, various material systems, for example, GaAs/AlGaAs, InAs/AlSb, GaN/AlGaN, and SiGe/Si, can be used. Moreover, as the crystal growth method of the semiconductor, various methods can be used.

As the lamination structure in the active layer of the semiconductor light emitting device and the semiconductor lamination structure as a whole of the light emitting device, various structures can be used as well as the structure shown in FIG. 9 to FIG. 11. Generally, the semiconductor light emitting device is configured so as to include a semiconductor substrate and an active layer configured as described above and provided on the semiconductor substrate. Moreover, the layer thicknesses and carrier densities, etc., of the semiconductor layers constituting the light emitting device may be optimized as appropriate according to the specific configuration of the device. In addition, in the configuration example described above, a configuration lattice-matched to the InP substrate is described, however, for example, a configuration introducing lattice-mismatch to the InP substrate can also be used. In this case, the degree of freedom in device design can be increased etc.

The semiconductor light emitting device according to the above-described embodiment includes (1) a semiconductor substrate; and (2) an active layer provided on the semiconductor substrate and having a cascade structure formed by alternately laminating quantum well emission layers and injection layers by multistage-laminating unit laminate structures each including the quantum well emission layer and the injection layer, wherein (3) the unit laminate structure included in the active layer has, in its subband level structure, a first upper level, a second upper level as an energy level higher than the first upper level, and a lower level which are formed in the quantum well emission layer, and an injection level which is formed in the injection layer, (4) the quantum well emission layer has, in order from the unit laminate structure side of the preceding stage, first to n-th barrier layers (n is an integer of 2 or more) and first to n-th well layers, and the first barrier layer is configured as an injection barrier layer for electrons from the injection layer of the preceding stage to the quantum well emission layer, (5) the injection layer has, in order from the quantum well emission layer side, first to m-th barrier layers (m is an integer of 2 or more) and first to m-th well layers, and the first barrier layer is configured as an exit barrier layer for electrons from the quantum well emission layer to the injection layer, (6) an energy interval between the first upper level and the second upper level is set to be smaller than the energy of a longitudinal optical phonon, and a layer thickness of the exit barrier layer is set in a range not less than 70% and not more than 150% of a layer thickness of the injection barrier layer, and (7) light is generated by emission transition using the subband level structure including the first upper level, the second upper level, and the lower level in the quantum well emission layer, and electrons after the emission transition are injected from the lower level into the second upper level in the quantum well emission layer of the subsequent stage via the injection level in the injection layer.

Here, preferably, in the emission transition in the quantum well emission layer, specifically, due to electron-electron interaction between an electron injected into the second upper level and an electron present in the lower level, a 4-2 polariton is generated, and the 4-2 polariton relaxes to a 3-2 polariton with the first upper level by inter-polariton transition due to an LO phonon, and accordingly, light is generated. Accordingly, light generation according to generation and transition of polaritons in the active layer can be preferably realized.

In the above-described semiconductor light emitting device, preferably, the layer thickness of the exit barrier layer is set so that the tunneling time of electrons from the lower level in the quantum well emission layer to the injection level in the injection layer becomes longer than the relaxation time of electrons from the first upper level to the lower level in the quantum well emission layer. Accordingly, electrons present at the lower level become sufficiently high in density, and efficiencies of generation of a polariton due to interaction between an electron at the second upper level and an electron at the lower level and succeeding emission transition can be improved.

In the unit laminate structure including the emission layer and the injection layer, the injection layer is preferably doped so that the carrier density falls within a range not less than $5 \times 10^{17}$ cm$^{-3}$ and not more than $1 \times 10^{19}$ cm$^{-3}$. Accordingly, electrons serving as carriers can be sufficiently supplied to the quantum well structure of the active layer, and efficiencies of generation of a polariton by electron-electron interaction and succeeding emission transition can be further improved.

The above-described semiconductor light emitting device may be configured as a laser device which includes a guide layer formed on one surface of the active layer, and a cladding layer formed on a surface of the guide layer on a side opposite to the active layer, and having a diffraction grating formed at an interface with the guide layer, and has a distributed feedback type resonator structure using the diffraction grating. When the light emitting device having the aforementioned configuration is configured as a laser device, the distributed feedback (DFB) type structure can be preferably used as a resonator structure. Alternatively, as the resonator structure of the light emitting device, other structures for example, such as a Fabry-Perot (FP) type resonator structure may be used.

The present invention is usable as a semiconductor light emitting device using polaritons, capable of performing a light emitting operation by current injection.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor light emitting device comprising:

a semiconductor substrate; and an active layer provided on the semiconductor substrate and having a cascade structure formed by alternately laminating quantum well emission layers and injection layers by multistage-laminating unit laminate structures each including the quantum well emission layer and the injection layer, wherein the unit laminate structure included in the active layer has, in its subband level structure, a first upper level, a second upper level as an energy level higher than the first upper level, and a lower level which are formed in the quantum well emission layer, and an injection level which is formed in the injection layer, the quantum well emission layer has, in order from the unit laminate structure side of the preceding stage, first to n-th barrier layers (n is an integer of 2 or more) and first to n-th well layers, where the first barrier layer is an injection barrier layer for electrons from the injection layer of the preceding stage to the quantum well emission layer, the injection layer has, in order from the quantum well emission layer side, first to m-th barrier layers (m is an integer of 2 or more) and first to m-th well layers, where the first barrier layer is an exit barrier layer for electrons from the quantum well emission layer to the injection layer, an energy interval between the first upper level and the second upper level is smaller than the energy of a longitudinal optical phonon, the injection barrier layer has a layer thickness thicker than layer thicknesses of the second to n-th barrier layers in the quantum well emission layer and layer thicknesses of the second to m-th barrier layers in the injection layer;

the exit barrier layer has a layer thickness thicker than layer thicknesses of the second to n-th barrier layers in the quantum well emission layer and layer thicknesses of the second to m-th barrier layers in the injection layer; and the layer thickness of the exit barrier layer is set in a range not less than 70% and not more than 150% of the layer thickness of the injection barrier layer, and light is generated by emission transition using the subband level structure formed by the first upper level, the second upper level, and the lower level in the quantum well emission layer, and electrons after the emission transition are injected from the lower level into the second upper level in the quantum well emission layer of the subsequent stage via the injection level in the injection layer.

2. The semiconductor light emitting device according to claim 1, wherein in the emission transition in the quantum well emission layer, due to electron-electron interaction between an electron injected into the second upper level and an electron present in the lower level, a 4-2 polariton is generated, and this 4-2 polariton relaxes to a 3-2 polariton with the first upper level by inter-polariton transition by means of an LO phonon, and accordingly, light is generated without forming a population inversion between the upper level and the lower level.

3. The semiconductor light emitting device according to claim 1, wherein the layer thickness of the exit barrier layer is set so that a tunneling time of electrons from the lower level in the quantum well emission layer to the injection level in the injection layer becomes longer than a relaxation time of electrons from the first upper level to the lower level in the quantum well emission layer.

4. The semiconductor light emitting device according to claim 1, wherein the injection layer is doped so that a carrier density falls within a range not less than $5 \times 10^{17}$ cm$^{-3}$ and not more than $1 \times 10^{19}$ cm$^{-3}$.

5. The semiconductor light emitting device according to claim 1, wherein the semiconductor light emitting device is configured as a laser device which includes:

a guide layer formed on one surface of the active layer, and
a cladding layer formed on a surface of the guide layer on a side opposite to the active layer, and having a diffraction grating formed at an interface with the guide layer, and has a distributed feedback type resonator structure using the diffraction grating.

* * * * *